US012685160B2

(12) United States Patent
Kim

(10) Patent No.: US 12,685,160 B2
(45) Date of Patent: Jul. 14, 2026

(54) SEMICONDUCTOR PACKAGE AND SEMICONDUCTOR DEVICE INCLUDING THE SAME

(71) Applicant: SAMSUNG ELECTRONICS CO., LTD., Suwon-si (KR)

(72) Inventor: Youngdeuk Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 421 days.

(21) Appl. No.: 18/218,322

(22) Filed: Jul. 5, 2023

(65) Prior Publication Data

US 2024/0162115 A1      May 16, 2024

(30) Foreign Application Priority Data

Nov. 16, 2022    (KR) ........................ 10-2022-0153559

(51) Int. Cl.
H10W 40/43          (2026.01)
H10W 70/63          (2026.01)
          (Continued)

(52) U.S. Cl.
CPC ......... H10W 40/43 (2026.01); H10W 70/635 (2026.01); H10W 90/00 (2026.01);
          (Continued)

(58) Field of Classification Search
CPC ... H01L 23/467; H01L 24/73; H01L 25/0652; H01L 23/34; H01L 25/0657; H01L 24/16; H01L 23/49827; H01L 23/481; H01L 24/32; H01L 25/18; H01L 25/50; H01L 24/17; H01L 24/13; H01L 23/5381; H01L 23/552; H01L 23/3135; H01L 23/5386; H01L 23/3121; H01L 25/105; H01L 23/5286; H01L 2224/16227; H01L 2924/1431; H01L 2224/32145; H01L 2224/32225; H01L 2224/16148; H01L 2225/06517; H01L 2225/06513; H01L 2224/73204; H01L 2225/06541; H01L 2225/06589; H01L 2924/16787; H01L 23/49833; H01L 2924/15311; H01L 2924/16747; H01L 2924/10253;
          (Continued)

(56) References Cited

U.S. PATENT DOCUMENTS

| | | | |
|---|---|---|---|
| 8,749,528 B2 | 6/2014 | Imai et al. | |
| 9,651,431 B2 | 5/2017 | Kim et al. | |

(Continued)

*Primary Examiner* — Mouloucoulaye Inoussa
(74) *Attorney, Agent, or Firm* — Sughrue Mion, PLLC

(57)          ABSTRACT

A semiconductor package includes: a first semiconductor chip; a plurality of second semiconductor chips sequentially stacked on the first semiconductor chip, the plurality of second semiconductor chips including an uppermost semiconductor chip including a central region and a peripheral region at a periphery of the central region; at least one first temperature sensor provided on an upper surface of the uppermost semiconductor chip in the central region; a plurality of second temperature sensors provided on the upper surface in the peripheral region; and a thermal conductive member provided on the uppermost semiconductor chip and covering the at least one first temperature sensor and the plurality of second temperature sensors.

20 Claims, 5 Drawing Sheets

(51) Int. Cl.

| | |
|---|---|
| *H10W 74/15* | (2026.01) |
| *H10W 90/00* | (2026.01) |

(52) U.S. Cl.
CPC .......... *H10W 74/15* (2026.01); *H10W 90/722* (2026.01); *H10W 90/724* (2026.01); *H10W 90/732* (2026.01); *H10W 90/734* (2026.01)

(58) Field of Classification Search
CPC . H01L 2924/16251; H01L 2224/13111; H01L 2924/1033; H01L 2924/1434; H01L 2924/16152; H01L 2224/04105; H01L 2225/1058; H01L 2225/1088; H01L 2224/12105; H01L 2225/1035; G11C 7/04; G06F 1/324; G06F 1/3287; G06F 1/3243; G06F 1/3296; G06F 1/206; G06F 1/3206; G06F 1/3203; G05B 6/02
See application file for complete search history.

(56) References Cited

U.S. PATENT DOCUMENTS

| | | | |
|---|---|---|---|
| 10,083,891 B1* | 9/2018 | Graf ........................ H01L 25/16 | |
| 10,224,078 B2 | 3/2019 | Goto et al. | |
| 10,672,964 B2 | 6/2020 | Saeedi et al. | |
| 10,748,874 B2 | 8/2020 | Brewer | |
| 10,878,881 B1* | 12/2020 | Hsu ......................... G11C 5/04 | |
| 11,119,908 B2 | 9/2021 | Walker et al. | |
| 2008/0169860 A1 | 7/2008 | Song | |
| 2012/0061059 A1* | 3/2012 | Hsiao ..................... H01L 25/16 | |
| | | | 165/104.33 |
| 2012/0287731 A1* | 11/2012 | Kim ........................ G11C 7/04 | |
| | | | 365/230.03 |
| 2015/0262708 A1* | 9/2015 | Lee ......................... H01L 25/18 | |
| | | | 365/191 |
| 2016/0133605 A1* | 5/2016 | Bae ..................... H01L 23/5385 | |
| | | | 257/783 |
| 2019/0161341 A1* | 5/2019 | Howe ...................... G11C 5/04 | |
| 2019/0198489 A1* | 6/2019 | Kim ...................... H01L 23/481 | |
| 2021/0407887 A1* | 12/2021 | Yu ....................... H01L 23/3157 | |
| 2022/0013445 A1* | 1/2022 | Kim ...................... H01L 23/147 | |
| 2022/0013475 A1* | 1/2022 | Kim ...................... H01L 23/562 | |
| 2022/0013505 A1* | 1/2022 | Sethuraman ........ H01L 25/0657 | |
| 2022/0020701 A1* | 1/2022 | Ko .................... H01L 23/49827 | |
| 2022/0037255 A1* | 2/2022 | Hwang .................. H01L 25/18 | |
| 2022/0093582 A1* | 3/2022 | Kim ........................ H01L 25/50 | |
| 2022/0181302 A1* | 6/2022 | Park .................... H01L 25/0657 | |
| 2022/0189916 A1* | 6/2022 | Jung ....................... H01L 24/73 | |
| 2022/0300049 A1* | 9/2022 | Dahiya .................. G06F 1/324 | |
| 2022/0328445 A1* | 10/2022 | Yu ........................... H01L 25/50 | |
| 2023/0062468 A1* | 3/2023 | Chiu ....................... H01L 25/18 | |
| 2023/0063147 A1* | 3/2023 | Yu ........................... H01L 25/18 | |
| 2023/0075909 A1* | 3/2023 | Hung ................. H01L 23/4006 | |
| 2023/0121072 A1* | 4/2023 | Lee ......................... G06F 1/206 | |
| | | | 713/300 |
| 2023/0352463 A1* | 11/2023 | Jeng .................... H01L 23/5381 | |
| 2024/0038617 A1* | 2/2024 | Hung ................. H01L 23/3737 | |
| 2024/0128150 A1* | 4/2024 | Tong ................. H01L 23/49822 | |
| 2024/0133946 A1* | 4/2024 | Jones ................. G01R 31/2874 | |
| 2024/0379498 A1* | 11/2024 | Tong ................... H01L 21/4853 | |
| 2025/0309215 A1* | 10/2025 | Bhushan ................. H01L 22/32 | |

* cited by examiner

<u>1</u>

SEMICONDUCTOR PACKAGE AND SEMICONDUCTOR DEVICE INCLUDING THE SAME

CROSS-REFERENCE TO RELATED APPLICATION

This application claims priority under 35 U.S.C. § 119 to Korean Patent Application No. 10-2022-0153559, filed on Nov. 16, 2022, in the Korean Intellectual Property Office, the disclosure of which is incorporated by reference herein in its entirety.

BACKGROUND

1. Field

Example embodiments of the present disclosure relate to a semiconductor package and a semiconductor device including the same, and more particularly, to a semiconductor package including a plurality of stacked different semiconductor chips and a semiconductor device including the same.

2. Description of Related Art

As semiconductor technology advances, the importance of heat dissipation characteristics of a semiconductor package may increase. In a semiconductor package in which a plurality of semiconductor chips are sequentially stacked, such as a high bandwidth memory (HBM) device, heat dissipation performance in a vertical direction may be important for heat transfer to a cooling device provided thereon. Degradation may occur in a thermal interface material (TIM) provided between the cooling device and the semiconductor package, and a temperature of the semiconductor package may be increased. When one temperature sensor is provided on a central region that is located on a hot spot of the semiconductor package, deterioration of the thermal conductive member that occurs on a peripheral region may not be detected.

SUMMARY

Example embodiments provide a semiconductor package including a plurality of temperature sensors configured to acquire temperature data for detecting deterioration of a thermal conductive member on a peripheral region surrounding a central region, and a semiconductor device including the semiconductor package.

According to an aspect of an example embodiment, a semiconductor package includes: a first semiconductor chip; a plurality of second semiconductor chips sequentially stacked on the first semiconductor chip, the plurality of second semiconductor chips including an uppermost semiconductor chip including a central region and a peripheral region at a periphery of the central region; at least one first temperature sensor provided on an upper surface of the uppermost semiconductor chip in the central region; a plurality of second temperature sensors provided on the upper surface in the peripheral region; and a thermal conductive member provided on the uppermost semiconductor chip and covering the at least one first temperature sensor and the plurality of second temperature sensors.

According to an aspect of an example embodiment, a semiconductor device includes: a semiconductor substrate; a semiconductor package provided on the semiconductor substrate; a cooling device provided on the semiconductor package and configured to absorb heat that is generated from the semiconductor package; and a logic semiconductor chip provided on the semiconductor substrate and spaced apart from the semiconductor package, wherein the semiconductor package includes: a first semiconductor chip; a plurality of second semiconductor chips sequentially stacked on the first semiconductor chip, the plurality of second semiconductor chips including an uppermost semiconductor chip including a central region, a plurality of corner regions provided at a periphery of the central region, and a plurality of edge regions provided at the periphery of the central region; at least one first temperature sensor provided on an upper surface of the uppermost semiconductor chip in the central region; a plurality of second temperature sensors provided on the upper surface of the uppermost semiconductor chip in the plurality of corner regions and the plurality of edge regions; and a thermal conductive member provided between the uppermost semiconductor chip and the cooling device, and configured to transmit heat that is generated from the semiconductor package to the cooling device.

According to an aspect of an example embodiment, a semiconductor device includes: a first semiconductor chip including: a central region; a peripheral region provided at a periphery of the central region; a plurality of first through electrodes; a plurality of first wires; and a plurality of first conductive bumps configured to transmit data; a plurality of second semiconductor chips sequentially stacked on the first semiconductor chip, the plurality of second semiconductor chips including: a plurality of second through electrodes; a plurality of second wires; and a plurality of second conductive bumps configured to transmit data; at least one first temperature sensor provided on the central region of an uppermost semiconductor chip of the plurality of second semiconductor chips; a plurality of second temperature sensors provided on the peripheral region of the uppermost semiconductor chip of the plurality of second semiconductor chips; a thermal conductive member provided on the uppermost semiconductor chip of the plurality of second semiconductor chips and covering the at least one first temperature sensor and the plurality of second temperature sensors; a cooling device provided on the thermal conductive member and configured to cool heat that is emitted from the first semiconductor chip and the plurality of second semiconductor chips; and a logic semiconductor chip configured to determine a heat dissipation state using temperature data obtained from the at least one first temperature sensor and the plurality of second temperature sensors, wherein the at least one first temperature sensor and the plurality of second temperature sensors are configured to transmit the temperature data obtained from the uppermost semiconductor chip to the logic semiconductor chip through the plurality of first through electrodes, the plurality of second through electrodes, the plurality of first wires, the plurality of second wires, the plurality of first conductive bumps and the plurality of second conductive bumps, and wherein a distance between adjacent ones of the at least one first temperature sensor and the plurality of second temperature sensors is a same first distance.

BRIEF DESCRIPTION OF THE DRAWINGS

The above and other aspects and features will be more apparent from the following detailed description of example embodiments taken in conjunction with the accompanying drawings, in which.

DETAILED DESCRIPTION

Figure 1:
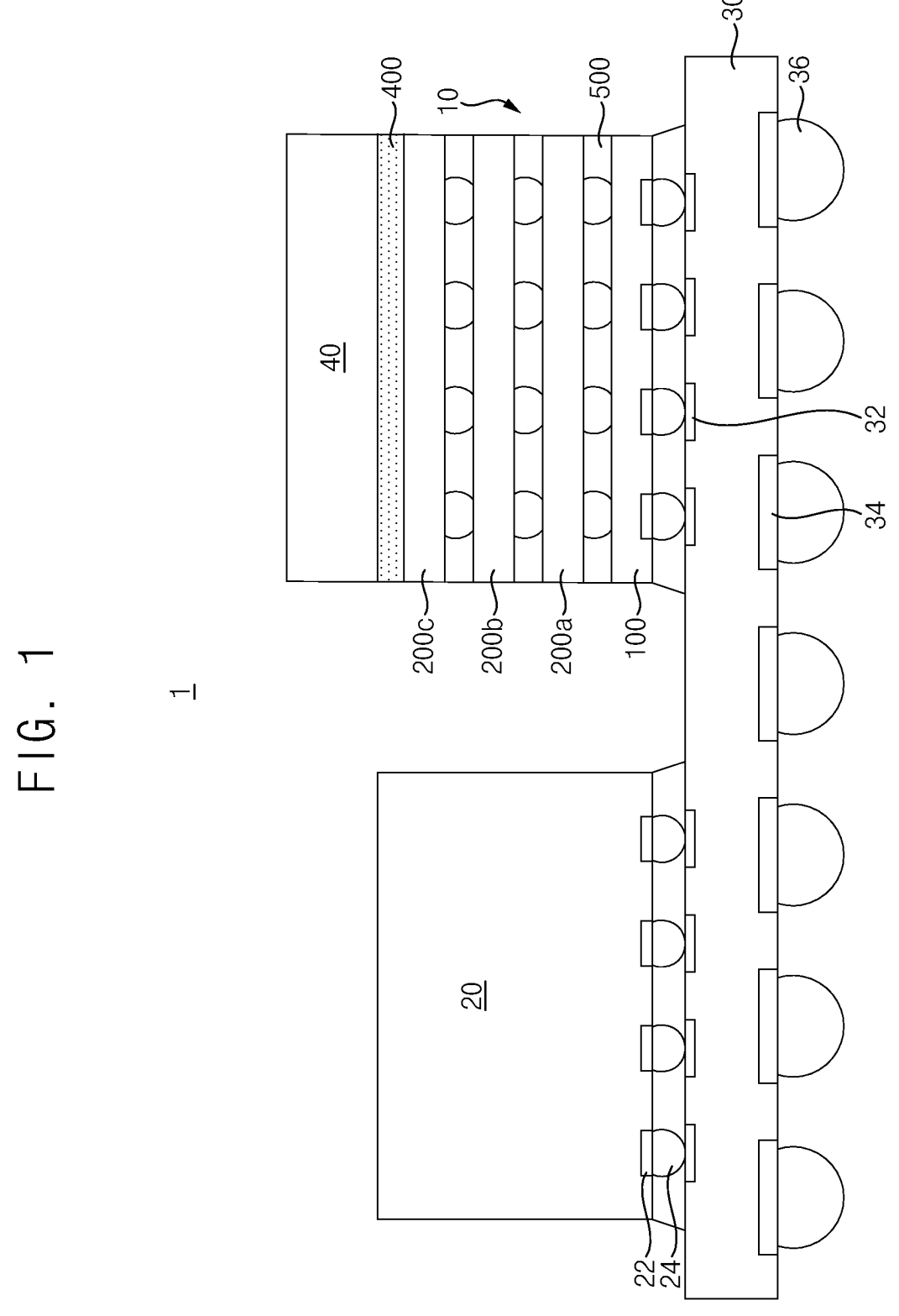
FIG. 1 is a cross-sectional view illustrating a semiconductor device in accordance with one or more example embodiments.

Hereinafter, one or more example embodiments will be explained in detail with reference to the accompanying drawings. The same reference numerals are used for the same components in the drawings, and duplicate descriptions thereof are omitted.

Figure 2:
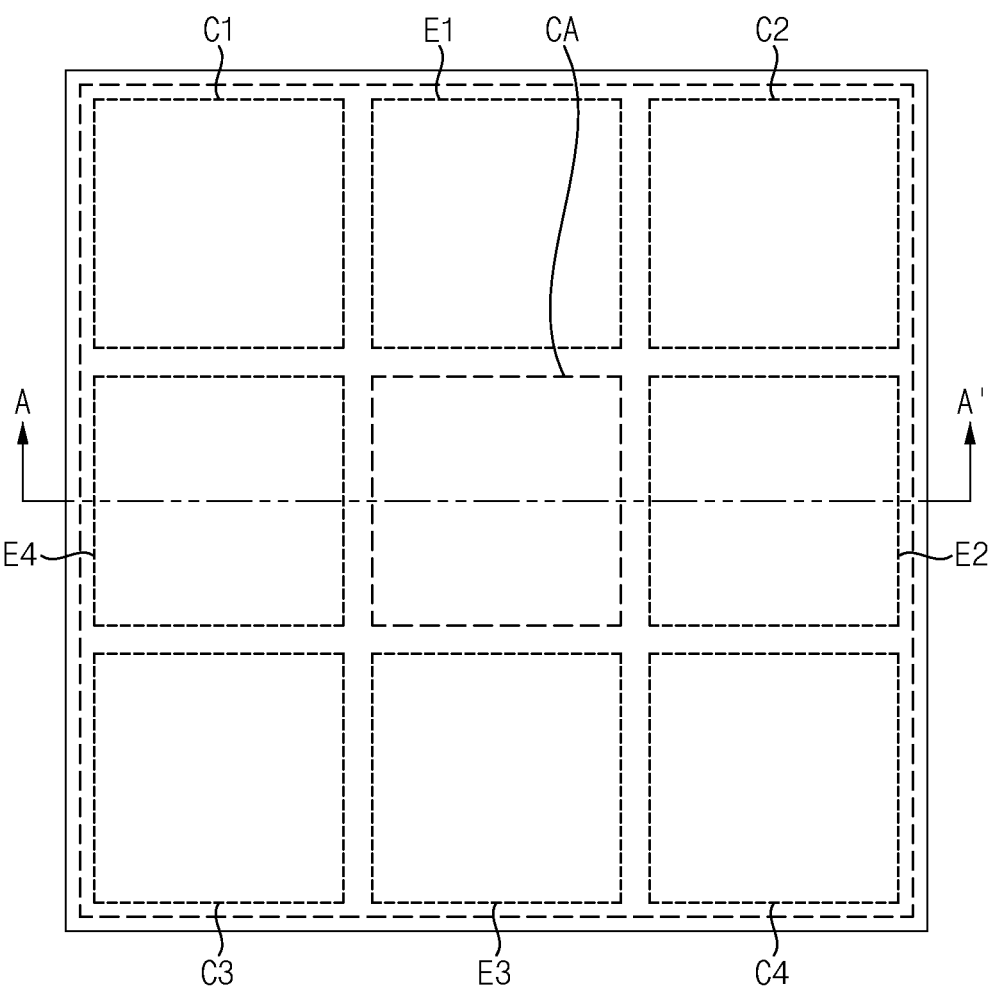
FIG. 2 is a plan view illustrating a semiconductor package in accordance with one or more example embodiments.
Figure 3:
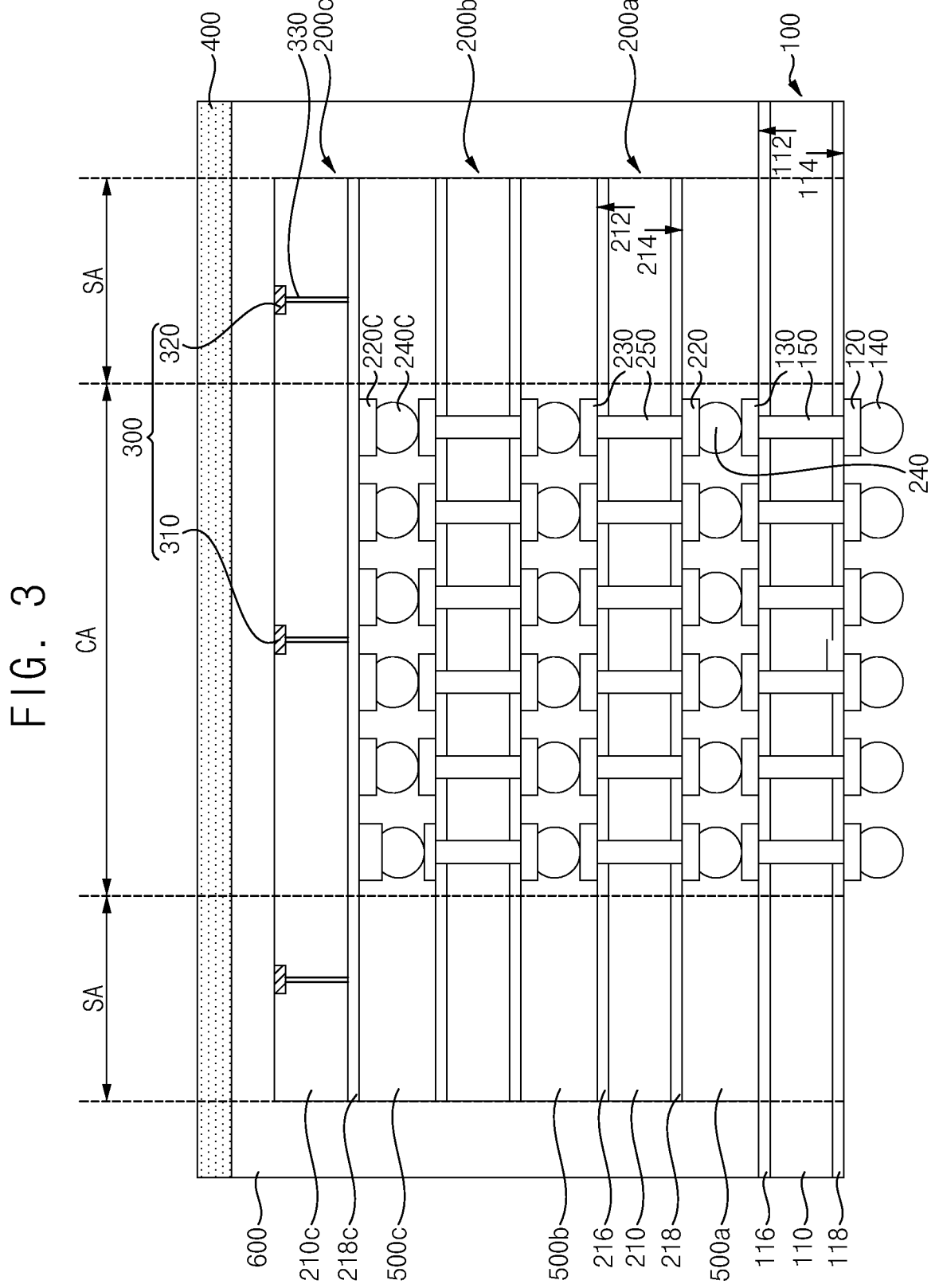
FIG. 3 is a cross-sectional view taken along the line A-A' in FIG. 2 in accordance with one or more example embodiments.
Figure 4:
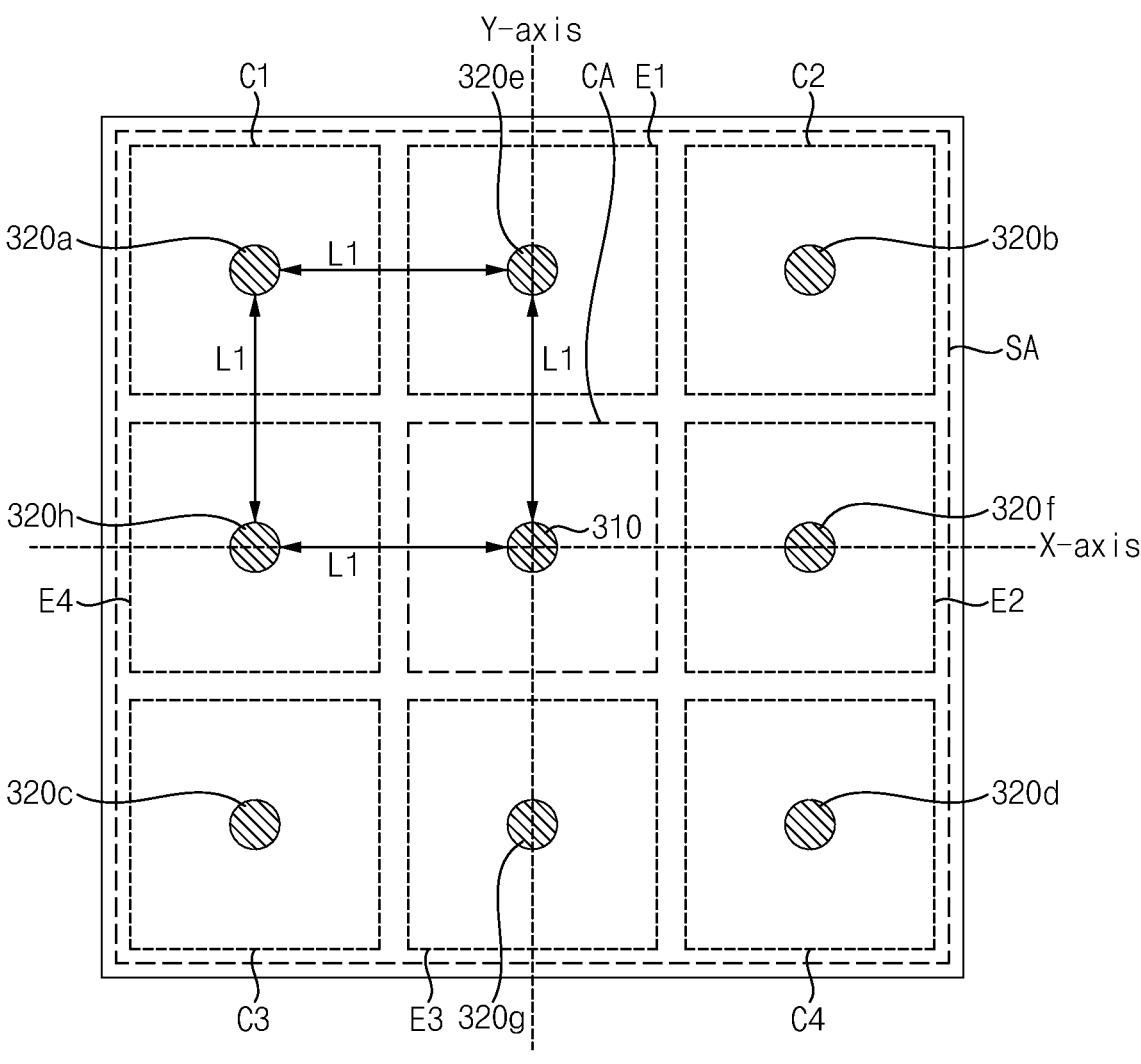
FIG. 4 is a view illustrating temperature sensors arranged on an uppermost semiconductor chip in accordance with one or more example embodiments.

FIG. 1 is a cross-sectional view illustrating a semiconductor device in accordance with one or more example embodiments. FIG. 2 is a plan view illustrating a semiconductor package in accordance with one or more example embodiments. FIG. 3 is a cross-sectional view taken along the line A-A' in FIG. 2 in accordance with one or more example embodiments. FIG. 4 is a view illustrating temperature sensors arranged on an uppermost semiconductor chip in accordance with one or more example embodiments.

Referring to FIGS. 1, 2, 3 and 4, a semiconductor device 1 may include a semiconductor substrate 30, a semiconductor package 10 and a logic semiconductor chip 20 that are arranged on the semiconductor substrate 30, a cooling device 40 provided on the semiconductor package 10, and a thermal conductive member 400 provided between the semiconductor package 10 and the cooling device 40.

In one or more example embodiments, the semiconductor device 1 may comprise a memory device that has a stacked chip structure in which a plurality of dies (chips) are stacked. For example, the semiconductor device 1 may include a semiconductor memory device having a 2.5D chip structure. According to one or more example embodiments, the semiconductor package 10 may include a memory semiconductor device, and the logic semiconductor chip 20 may include a logic semiconductor device. The logic semiconductor device may include an application-specific integrated circuit (ASIC) as a host such as a central processing unit (CPU), graphics processing unit (GPU), or system-on-chip (SoC), or the like. The memory semiconductor device may include a high bandwidth memory (HBM) device.

In one or more example embodiments, the semiconductor substrate 30 may include a substrate that has upper and lower surfaces facing each other. For example, the semiconductor substrate 30 may include, but is not limited to, a printed circuit board (PCB). The printed circuit board may comprise a multilayer circuit board that comprises vias and various circuits. According to one or more example embodiments, the semiconductor substrate 30 may include an interposer.

The semiconductor substrate 30 may include a plurality of first substrate pads 32 exposed from the upper surface, a plurality of second substrate pads 34 exposed from the lower surface, and a plurality of external connection members 36 respectively provided on the second substrate pads 34. The logic semiconductor chip 20 may be arranged on the first substrate pads 32 of the semiconductor substrate 30 through the solder bumps 24 that are provided on chip pads 22. The semiconductor device 1 may be electrically connected to other semiconductor devices through the external connection members 36.

The semiconductor package 10 and the logic semiconductor chip 20 may be electrically connected to each other through redistribution wires inside the semiconductor substrate 30. The semiconductor substrate 30 may provide a high density interconnection between the semiconductor package 10 and the logic semiconductor chip 20.

In one or more example embodiments, the cooling device 40 may be provided above the semiconductor package 10 to absorb heat that is emitted from the semiconductor package 10. The cooling device 40 may contact the thermal conductive member 400 on the semiconductor package 10. For example, the cooling device 40 may include a fan, a heat sink, and the like.

In one or more example embodiments, the semiconductor package 10 may include a plurality of stacked semiconductor chips. The semiconductor package 10 may include a first semiconductor chip 100, and second semiconductor chips 200a, 200b, and 200c sequentially stacked on the first semiconductor chip 100. The semiconductor package 10 may include a sensor portion 300 that is provided on the plurality of semiconductor chips to measure heat that is emitted from the plurality of semiconductor chips. The semiconductor package 10 may include an adhesive member 500 provided between the first semiconductor chip 100 and the second semiconductor chips 200a, 200b, and 200c. The adhesive member 500 may attach the first semiconductor chip 100 and the second semiconductor chips 200a, 200b, and 200c to each other.

The plurality of semiconductor chips 100, 200a, 200b, and 200c may be vertically stacked. In one or more example embodiments, the first and second semiconductor chips 100, 200a, 200b, and 200c may be substantially the same as, or similar to, each other. Thus, the same or similar components are denoted by the same or similar reference numerals, and repeated descriptions of the same components has been omitted.

In one or more example embodiments, the semiconductor package may be a multi-chip package including four stacked semiconductor chips 100, 200a, 200b, 200c. However, one or more example embodiments are not limited thereto, and for example, the semiconductor package may include 8, 12, or 16, or any number of stacked semiconductor chips.

Each of the first and second semiconductor chips 100, 200a, 200b, 200c may include an integrated circuit chip manufactured by performing a semiconductor manufacturing processes. Each of the semiconductor chips may include, for example, a memory chip or a logic chip.

Hereinafter, the first semiconductor chip 100 will be described according to one or more example embodiments.

The first semiconductor chip 100 may include a first substrate 110 having a first upper surface 112 and a first lower surface 114 opposite to each other, a first connecting pad 120 provided on the first lower surface 114, a first bonding pad 130 provided on the first upper surface 112, and a first conductive bump 140 provided on the first connecting pad 120. Also, the first semiconductor chip 100 may further include a first through electrode 150 penetrating the first substrate 110, and a first protective layer 116 provided on the first upper surface 112.

The first upper surface 112 of the first substrate 110 may be an inactive surface, and the first lower surface 114 may be an active surface. Circuit patterns may be provided on the first lower surface 114 of the first substrate 110. The first lower surface 114 may be referred to as a front side surface on which the circuit patterns are formed, and the first upper surface 112 may be referred to as a back side surface.

For example, the first substrate 110 may include a semiconductor material such as silicon, germanium, or silicon-germanium. The first substrate 110 may include a III-V compound such as gallium phosphide (GaP), gallium arsenide (GaAs), or gallium antimonide (GaSb). In one or more example embodiments, the first substrate 110 may include a Silicon-On-Insulator (SOI) substrate or a Germanium-On-Insulator (GOI) substrate.

The circuit patterns may include transistors, diodes, and the like. The circuit patterns may comprise circuit elements. Thus, the first semiconductor chip 100 may be referred to a semiconductor device in which a plurality of the circuit elements is formed therein.

In one or more example embodiments, a first activation layer 118 may be provided on the first lower surface 114 of the first substrate 110. The first activation layer 118 may include an insulating layer, and a plurality of first redistribution wires provided in the insulating layer. The first redistribution wires may be connected to one side of the first through electrode 150. The first connecting pad 120 may be connected to the first redistribution wires that are electrically connected to the first through electrode 150. The insulating layer may include silicon oxide, carbon-doped silicon oxide, silicon carbonitride (SiCN), and the like.

The first conductive bump 140 may be provided on the first connecting pad 120. The first conductive bump 140 may provide an electrical path that is capable of electrically connecting the first semiconductor chip 100 to another semiconductor device. The first conductive bump 140 may mount the first semiconductor chip 100 on the other semiconductor device. For example, the first conductive bumps 140 may include micro bumps (uBumps).

A first protective layer 116 may be provided on the first upper surface 112 of the first substrate 110. The first protective layer 116 may include an insulating material to protect the first substrate 110. The first protective layer 116 may include an oxide film or a nitride film, or may include a double layer of an oxide film and a nitride film. The first protective layer 116 may be formed of an oxide film, for example, a silicon oxide film ($SiO_2$) by a high-density plasma chemical vapor deposition (HDP-CVD) process.

The first bonding pad 130 may be formed on the first protective layer 116, and may be electrically connected to the first through electrode 150. The first bonding pad 130 may be electrically connected to the first through electrode 150 at a first side that is opposite to a second side of the first through electrode 150.

The first through electrode 150 may penetrate through the first substrate 110 in a vertical direction. A first end of the first through electrode 150 may be electrically connected to the redistribution wires. A second end of the first through electrode 150 may be exposed from the first upper surface 112 of the first substrate 110. The first through electrode 150 may be electrically connected to the first bonding pad 130 through the exposed second end.

The first connecting pad 120, the first bonding pad 130, and the first through electrode 150 may include a same metal. For example, the metal may include copper (Cu), aluminum (Al), tungsten (W), nickel (Ni), molybdenum (Mo), gold (Au), silver (Ag), chromium (Cr), tin (Sn), and titanium (Ti), or the like. However, the metal is not limited thereto, and the metal may include materials capable of being bonded by interdiffusion of metals by a high-temperature annealing process.

In one or more example embodiments, a plurality of the second semiconductor chips 200a, 200b, and 200c may be sequentially stacked on the first semiconductor chip 100. The second semiconductor chips 200a, 200b, and 200c may include an uppermost semiconductor chip 200c that is arranged at a top.

The uppermost semiconductor chip 200c may include a central region CA and a peripheral region SA on the periphery of the central region CA. The peripheral region SA may include a plurality of corner regions C1, C2, C3, and C4 provided on respective corners of the uppermost semiconductor chip 200c, and a plurality of edge regions E1, E2, E3, and E4 provided on respective edges of the uppermost semiconductor chip 200c.

The second semiconductor chip 200a may include a second substrate 210 having a second upper surface 212 and a second lower surface 214 opposite to each other, a second connecting pad 220 provided on the second lower surface 214 of the second substrate 210, and a second conductive bump 240 provided on the second connecting pad 220. The second semiconductor chip 200a may further include a second bonding pad 230 provided on the second upper surface 212 of the second substrate 210, a second through electrode 250 penetrating the second substrate 210 in the vertical direction, and a second protective layer 216 provided on the second upper surface 212. A second activation layer 218 may be provided on the second lower surface 214 of the second substrate 210.

The second activation layer 218 may include an insulating layer, and a plurality of second redistribution wires provided in the insulating layer. The second redistribution wires may be connected to one side of the second through electrode 250. The second connecting pad 220 may be connected to the second redistribution wires that are electrically connected to the second through electrode 250.

The second lower surface 214 of the second substrate 210 may face the first upper surface 112 of the first substrate 110. The second conductive bumps 240 of the second semiconductor chip 200a may be directly bonded to the first bonding pads 130 of the first semiconductor chip 100. The second semiconductor chip 200a may be arranged on the first semiconductor chip 100 by a flip chip bonding method. The second connecting pad 220 of the second semiconductor chip 200a may be electrically connected to the first bonding pad 130 of the first semiconductor chip 100 through the second conductive bump 240.

In one or more example embodiments, the sensor portion 300 may be arranged on an upper surface of the uppermost semiconductor chip 200c. The sensor portion 300 may be provided on the second substrate 210c of the uppermost semiconductor chip 200c. The sensor portion 300 may include at least one first temperature sensor 310 provided on the central region CA, and a plurality of second temperature sensors 320 provided on the peripheral region SA. The second temperature sensors 320 may be provided on the corner regions C1, C2, C3, and C4 and the edge regions E1, E2, E3, and E4, respectively.

The first temperature sensor 310 may be provided in the second substrate 210c of the uppermost semiconductor chip 200c on the central region CA. According to one or more example embodiments, the first temperature sensor 310 may be exposed from the upper surface of the second substrate 210c of the uppermost semiconductor chip 200c. According to one or more example embodiments, the second substrate 210*c* may have a first cavity, in which the first temperature sensor 310 is arranged, on the upper surface of the second substrate 210*c*.

The second temperature sensors 320 may be provided in the second substrate 210*c* of the uppermost semiconductor chip 200*c* on the peripheral region SA. According to one or more example embodiments, the second temperature sensors 320 may be exposed from the upper surface of the second substrate 210*c* of the uppermost semiconductor chip 200*c*. According to one or more example embodiments, the second substrate 210*c* may have second cavities, in which the second temperature sensors 320 are arranged, on the upper surface, respectively.

The first and second temperature sensors 310 and 320 may be electrically connected to the sensor signal lines 330, respectively. The first and second temperature sensors 310 and 320 may transmit temperature data to the second activation layer 218*c* of the uppermost semiconductor chip 200*c* through the sensor signal lines 330. The sensor signal lines 330 may penetrate through the second substrate 210*c* in the vertical direction, and may be electrically connected to the second activation layer 218*c*. The second activation layer 218*c* may transmit the temperature data to the semiconductor chip 200*b* that is arranged under the uppermost semiconductor chip 200*c* through the second connecting pad 220*c* and the second conductive bump 240*c*.

The first temperature sensor 310 may be provided in the central region CA of the second upper surface 212 of the uppermost semiconductor chip 200*c*. The first temperature sensor 310 may be provided on a center of the central region CA. Because the first semiconductor chip 100 and the second semiconductor chips 200*a*, 200*b*, and 200*c* have a hot spot in the central region CA, the first temperature sensor 310 may obtain a temperature of heat that is generated from the hot spot in the central region CA.

At least some of the second temperature sensors 320, for instance, second temperature sensors 320*a*, 320*b*, 320*c*, and 320*d*, may be provided in first to fourth corner regions C1, C2, C3, and C4 of the second upper surface of the uppermost semiconductor chip 200*c*. The first to fourth corner regions C1, C2, C3, and C4 may be provided on vertex regions of the uppermost semiconductor chip 200*c* in the peripheral region SA of the uppermost semiconductor chip 200*c*. The number of second temperature sensors 320*a*, 320*b*, 320*c*, and 320*d* provided in each of the corner regions C1, C2, C3, and C4 may be the same. For example, the number of the second temperature sensors 320*a*, 320*b*, 320*c*, and 320*d* provided in each of the corner regions C1, C2, C3, and C4 may be within a range of 1 to 4.

Positions of the second temperature sensors 320*a*, 320*b*, 320*c*, and 320*d* provided in each of the corner regions C1, C2, C3, and C4 may be symmetrical to each other. The second temperature sensors 320*a*, 320*b*, 320*c*, and 320*d* may accurately measure the heat that is generated from the second upper surface 212 of the uppermost semiconductor chip 200*c* over a wide area through the positions symmetrical to each other.

For example, the position of the second temperature sensor 320*a* of the first corner region C1 may be symmetrical to the position of the second temperature sensor 320*b* of the second corner region C2 relative to the Y-axis. The position of the second temperature sensor 320*a* of the first corner region C1 may be symmetrical to the position of the second temperature sensor 320*d* of the third corner region C3 relative to the X-axis. The position of the second temperature sensor 320*b* of the second corner region C2 may be symmetrical to the position of the second temperature sensor 320*d* of the fourth corner region C4 relative to the X-axis. The position of the second temperature sensor 320*c* of the third corner region C3 may be symmetrical to the position of the second temperature sensor 320*d* of the fourth corner region C4 relative to the Y-axis.

At least some of the second temperature sensors 320 may be provided in the first to fourth edge regions E1, E2, E3, and E4 on the second upper surface of the uppermost semiconductor chip 200*c*. The first to fourth edge regions E1, E2, E3, and E4 may be provided adjacent to edges of the uppermost semiconductor chip 200*c* in the peripheral region SA of the uppermost semiconductor chip 200*c*. The first to fourth edge regions may be provided between the first to fourth corner regions. The number of second temperature sensors 320*e*, 320*f*, 320*g*, and 320*h* provided in each of the edge regions E1, E2, E3, and E4 may be the same. For example, the number of the second temperature sensors 320*e*, 320*f*, 320*g*, and 320*h* provided in each of the edge regions E1, E2, E3, and E4 may be within a range of 1 to 4.

Positions of the second temperature sensors 320*e*, 320*f*, 320*g*, and 320*h* provided in each of the edge regions E1, E2, E3, and E4 may be symmetrical to each other. The second temperature sensors 320*e*, 320*f*, 320*g*, and 320*h* may accurately measure the heat that is generated from the second upper surface of the uppermost semiconductor chip 200*c* over a wide area through the positions symmetrical to each other.

For example, the position of the second temperature sensor 320*e* of the first edge region E1 may be symmetrical with the position of the second temperature sensor 320*g* of the third edge region E3 relative to the X-axis. The location of the second temperature sensor 320*f* of the second edge region E2 may be symmetrical to the position of the second temperature sensor 320*h* of the fourth edge region E4 relative to the Y-axis.

Each of the first temperature sensor 310 and the second temperature sensors 320 may be spaced apart from each other by a same first distance L1 between the sensors that are arranged adjacent to each other. For example, the first distance L1 may be within a range of 5 mm to 20 mm.

The first temperature sensor 310 may be arranged adjacent to the second temperature sensors 320*e*, 320*f*, 320*g*, and 320*h* that are respectively arranged on the first to fourth edge regions E1, E2, E3, and E4. Distances of the second temperature sensors 320*e*, 320*f*, 320*g*, and 320*h* arranged on the first to fourth edge regions E1, E2, E3, and E4 from the first temperature sensor 310 may be the first distance L1.

The second temperature sensor 320*a* provided on the first corner region C1 may be adjacent to the second temperature sensors 320*e* and 320*h* that are arranged on the first and fourth edge regions E1 and E4, respectively. Distances of the second temperature sensors 320*e* and 320*h* that are arranged on the first and fourth edge regions E1 and E4, respectively, from the second temperature sensor 320*a* provided on the first corner region C1 may be the first distance L1.

The second temperature sensor 320*b* provided on the second corner region C2 may be adjacent to the second temperature sensors 320*e* and 320*f* that are arranged on the first and second edge regions E1 and E2. Distances of the second temperature sensors 320*e* and 320*f* that are arranged on the first and second edge regions E1 and E2, respectively, from the second temperature sensor 320*b* provided on the second corner region C2 may be the first distance L1.

The second temperature sensor 320*c* provided on the third corner region C3 may be adjacent to the second temperature sensors 320*g* and 320*h* that are arranged on the third and fourth edge regions E3 and E4. Distances of the second temperature sensors 320g and 320h that are arranged on the third and fourth edge regions E3 and E4, respectively, from the second temperature sensor 320c provided on the third corner region C3 may be the first distance L1.

The second temperature sensor 320d provided on the fourth corner region C4 may be adjacent to the second temperature sensors 320g and 320f that are arranged on the third and second edge regions E3 and E2. Distances of the second temperature sensors 320g and 320f that are arranged on the third and second edge regions E3 and E2, respectively, from the second temperature sensor 320d provided on the fourth corner region C4 may be the first distance L1.

In one or more example embodiments, the sensor portion 300 may transfer the temperature data that is obtained from the first and second temperature sensors 310 and 320 to the logic semiconductor chip 20. The logic semiconductor chip 20 may determine a heat dissipation state of the semiconductor package 10 through the temperature data that are obtained from the first and second temperature sensors 310 and 320, respectively. According to one or more example embodiments, at least one of the first semiconductor chip 100 and the second semiconductor chips 200a, 200b, and 200c may include a logic semiconductor circuit.

The logic semiconductor chip may receive a first temperature of the central region CA from the first temperature sensor 310. The logic semiconductor chip may receive a second temperature of the peripheral region SA from the second temperature sensors 320. The second temperature may be referred to a temperature measured from second temperature sensors 320 that are respectively provided in the corner regions C1, C2, C3, and C4 and in the edge regions E1, E2, E3, and E4.

When the second temperature obtained by at least one of the second temperature sensors 320 is higher than the first temperature obtained by the first temperature sensor 310, the logic semiconductor chip may determine that the heat dissipation state is insufficient.

The first temperature sensor 310 and the second temperature sensors 320 may transfer the temperature data of the first and second temperatures to the logic semiconductor chip through the first and second through electrodes 150 and 250, the first and second wires, and the first and second conductive bumps 140 and 240.

In one or more example embodiments, the adhesive member 500 may attach the first semiconductor chip 100 and the second semiconductor chips 200a, 200b, and 200c to each other. The adhesive members 500a, 500b, and 500c may be provided between the first semiconductor chip 100 and the second semiconductor chips 200, respectively. For example, the adhesive members 500a, 500b, and 500c may include a Non Conducted Film (NCF) material.

In one or more example embodiments, the semiconductor package 10 may further include a sealing member 600 covering the second semiconductor chips 200a, 200b, and 200c on the first semiconductor chip 100. The sealing member 600 may cover side surfaces of the second semiconductor chips 200. The sealing member 600 may cover the upper surface of the uppermost semiconductor chip 200c. For example, the sealing member 600 may include a thermosetting resin or the like.

In one or more example embodiments, the thermal conductive member 400 may be provided on an upper surface of the sealing member 600. The cooling device 40 may be provided on an upper surface of the thermal conductive member 400. The thermal conductive member 400 may transfer the heat that is generated from the semiconductor package 10 by contacting the cooling device 40. The thermal conductive member 400 may transfer the heat that is emitted from the upper surface of the sealing member 600 to the cooling device 40. The thermal conductive member 400 may activate heat flow between the semiconductor package 10 and the cooling device 40.

The thermal conductive member 400 may be degraded while transferring heat. When deterioration occurs in the thermal conductive member 400, the thermal conductive member 400 may separate from the sealing member 600 and the cooling device 40. The thermal conductive member 400 may be arranged to cover both the central region CA and the peripheral region SA. The logic semiconductor chip may determine the deterioration of the thermal conductive member 400 that occurs in the peripheral region SA through the temperature data that are obtained from the second temperature sensors 320.

As described above, the first temperature sensor 310 arranged on the central region CA may obtain a temperature of a hot spot of the semiconductor package 10. The second temperature sensors 320 arranged on the peripheral region SA may obtain an ambient temperature of the hot spot. The first and second temperature sensors 310 and 320 may be spaced apart from each other with the same distance between the first and second temperature sensors 310 and 320 arranged adjacent to each other. The second temperature sensors 320 may obtain a temperature distribution on the upper surface of the semiconductor package 10.

Also, the thermal conductive member 400 provided on the uppermost semiconductor chip 200c may generate heat flow. When the thermal conductive member 400 is degraded, adhesive strength of the thermal conductive member 400 may be weakened in the peripheral region SA. The second temperature sensors 320 distributed and arranged on the peripheral region SA may obtain the temperature data to specify a location where the deterioration of the thermal conductive member 400 has occurred therein.

Figure 5:
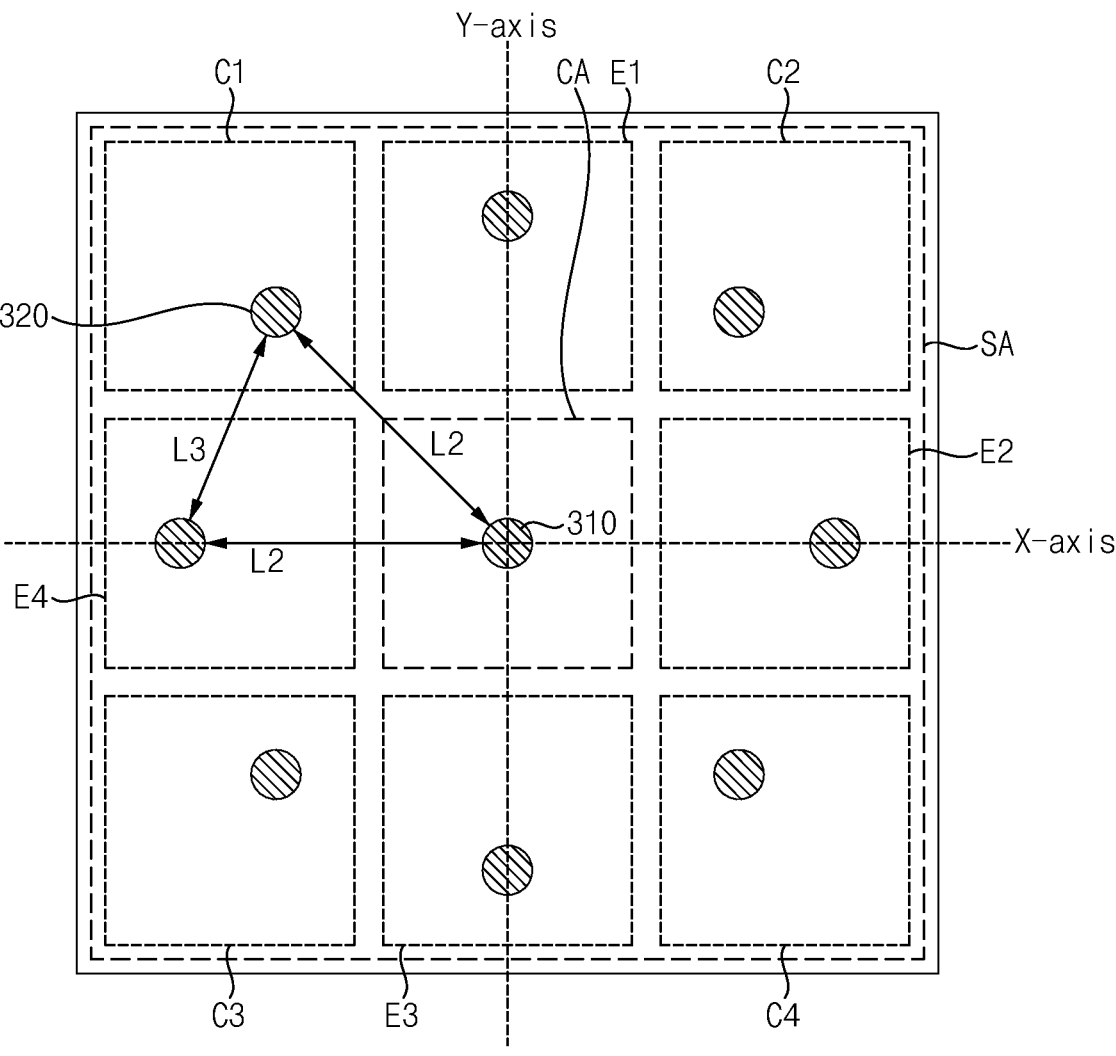
FIG. 5 is a view illustrating temperature sensors of a semiconductor package having another arrangement in accordance with one or more example embodiments.

FIG. 5 is a view illustrating temperature sensors of a semiconductor package having another arrangement in accordance with one or more example embodiments. The semiconductor package may be substantially the same as or similar to the semiconductor package described with reference to one or more example embodiments of FIGS. 1, 2, 3 and 4 except for a configuration of first and second temperature sensors. Thus, the same or similar components are denoted by the same or similar reference numerals, and repeated descriptions of the same components have been omitted.

In one or more example embodiments, the sensor portion 300 of the semiconductor package may be arranged on the uppermost semiconductor chip 200c. The sensor portion 300 may include at least one of the first temperature sensor 310 provided on the central region CA, and the plurality of second temperature sensors 320 provided on the peripheral region SA. The second temperature sensors 320 may be provided on the corner regions C1, C2, C3, and C4 and the edge regions E1, E2, E3, and E4, respectively.

The first temperature sensor 310 may be provided in the central region CA on the second upper surface of the uppermost semiconductor chip 200c. The first temperature sensor 310 may be provided in the center of the central area CA. Because the first semiconductor chip 100 and the second semiconductor chips 200a, 200b, and 200c have a hot spot in the central region CA, the first temperature sensor 310 may obtain the temperature of the heat that is generated from the hot spot in the central region CA.

Each of the second temperature sensors 320 may be spaced apart from the first temperature sensor 310 by a same second distance L2. When the number of second temperature sensors 320 is N, the second temperature sensors 320 may be arranged in an N-gonal shape when viewed from a plan view. The sensors arranged adjacent to each other among the second temperature sensors 320 may be spaced apart from each other with a third distance L3. For example, the second distance L2 may be within a range of 5 mm to 20 mm. According to one or more example embodiments, the third distance L3 may be within a range of 4 mm to 15 mm.

The foregoing is illustrative of example embodiments and is not to be construed as limiting thereof. Although a few example embodiments have been described above, it will be apparent to those skilled in the art that various changes in form and details may be made therein without departing from the spirit and scope of the following claims.

What is claimed is:

1. A semiconductor package comprising:
   a first semiconductor chip;
   a plurality of second semiconductor chips sequentially stacked on the first semiconductor chip, the plurality of second semiconductor chips comprising an uppermost semiconductor chip,
      wherein the uppermost semiconductor chip comprises:
         a central region; and
         a peripheral region at a periphery of the central region;
   at least one first temperature sensor provided on an upper surface of the uppermost semiconductor chip in the central region;
   a plurality of second temperature sensors provided on the upper surface of the uppermost semiconductor chip in the peripheral region, wherein the at least one first temperature sensor and the plurality of second temperature sensors are each configured to measure a temperature; and
   a thermal conductive member provided on the uppermost semiconductor chip and covering the at least one first temperature sensor and the plurality of second temperature sensors.

2. The semiconductor package of claim 1, wherein the peripheral region comprises:
   a plurality of corner regions respectively provided at corners of the uppermost semiconductor chip; and
   a plurality of edge regions respectively provided between adjacent corner regions of the plurality of corner regions on respective edges of the uppermost semiconductor chip, and
   wherein the plurality of second temperature sensors are respectively provided on the plurality of corner regions and the plurality of edge regions.

3. The semiconductor package of claim 1, wherein a distance between adjacent ones of the at least one first temperature sensor and the plurality of second temperature sensors is a same first distance.

4. The semiconductor package of claim 3, wherein the same first distance is between 5 mm and 20 mm.

5. The semiconductor package of claim 1, further comprising:
   a logic semiconductor chip configured to receive temperature data obtained from the at least one first temperature sensor and the plurality of second temperature sensors and to determine a heat dissipation state using the temperature data.

6. The semiconductor package of claim 5, wherein the logic semiconductor chip is further configured to determine that the heat dissipation state is insufficient based on a second temperature obtained by at least one of the plurality of second temperature sensors being higher than a first temperature obtained by the at least one first temperature sensor.

7. The semiconductor package of claim 1, wherein the first semiconductor chip comprises:
   a plurality of first through electrodes;
   a plurality of first wires; and
   a plurality of first conductive bumps that are configured to transmit data, and
   wherein each of the plurality of second semiconductor chips comprises:
   a plurality of second through electrodes;
   a plurality of second wires; and
   a plurality of second conductive bumps that are configured to transmit data.

8. The semiconductor package of claim 7, wherein each of the at least one first temperature sensor and each of the plurality of second temperature sensors are configured to transmit temperature data obtained from the upper surface through the plurality of first through electrodes, the plurality of second through electrodes, the plurality of first wires, the plurality of second wires, the plurality of first conductive bumps, and the plurality of second conductive bumps.

9. The semiconductor package of claim 1, further comprising:
   a cooling device provided on the thermal conductive member and configured to cool heat that is emitted from the first semiconductor chip and the plurality of second semiconductor chips.

10. The semiconductor package of claim 1, wherein each of the plurality of second temperature sensors is spaced apart from the at least one first temperature sensor by a same second distance.

11. A semiconductor device comprising:
   a semiconductor substrate;
   a semiconductor package provided on the semiconductor substrate;
   a cooling device provided on the semiconductor package and configured to absorb heat that is generated from the semiconductor package; and
   a logic semiconductor chip provided on the semiconductor substrate and spaced apart from the semiconductor package,
   wherein the semiconductor package comprises:
      a first semiconductor chip;
      a plurality of second semiconductor chips sequentially stacked on the first semiconductor chip, the plurality of second semiconductor chips comprising an uppermost semiconductor chip comprising a central region, a plurality of corner regions provided at a periphery of the central region, and a plurality of edge regions provided at the periphery of the central region;
      at least one first temperature sensor provided on an upper surface of the uppermost semiconductor chip in the central region;
      a plurality of second temperature sensors provided on the upper surface of the uppermost semiconductor chip in the plurality of corner regions and the plurality of edge regions; and
      a thermal conductive member provided between the uppermost semiconductor chip and the cooling device, and configured to transmit heat that is generated from the semiconductor package to the cooling device.

12. The semiconductor device of claim 11, wherein the plurality of corner regions are respectively provided on corners of the uppermost semiconductor chip, wherein the plurality of edge regions are respectively provided between adjacent corner regions of the plurality of corner regions on respective edges of the uppermost semiconductor chip, and wherein the plurality of second temperature sensors are respectively provided on the plurality of corner regions and the plurality of edge regions.

13. The semiconductor device of claim 11, wherein a distance between adjacent ones of the at least one first temperature sensor and the plurality of second temperature sensors is a same first distance between.

14. The semiconductor device of claim 13, wherein the same first distance is between 5 mm and 20 mm.

15. The semiconductor device of claim 11, wherein the logic semiconductor chip is configured to determine a heat dissipation state based on temperature data obtained from the at least one first temperature sensor and the plurality of second temperature sensors.

16. The semiconductor device of claim 15, wherein the logic semiconductor chip is configured to determine that the heat dissipation state is insufficient based on a second temperature obtained by at least one of the plurality of second temperature sensors being higher than a first temperature obtained by the at least one first temperature sensor.

17. The semiconductor device of claim 11, wherein the first semiconductor chip comprises:

a plurality of first through electrodes;

a plurality of first wires; and a plurality of first conductive bumps that are configured to transmit data, and wherein each of the plurality of second semiconductor chips comprises:

a plurality of second through electrodes;

a plurality of second wires; and a plurality of second conductive bumps that are configured to transmit data.

18. The semiconductor device of claim 17, wherein the at least one first temperature sensor and the plurality of second temperature sensors are configured to transmit temperature data obtained from the uppermost semiconductor chip to the logic semiconductor chip through the plurality of first through electrodes, the plurality of second through electrodes, the plurality of first wires, the plurality of second wires, the plurality of first conductive bumps and the plurality of second conductive bumps.

19. The semiconductor device of claim 11, wherein each of the plurality of second temperature sensors is spaced apart from the at least one first temperature sensor by a same second distance.

20. A semiconductor device comprising:

a first semiconductor chip comprising:

a central region;

a peripheral region provided at a periphery of the central region;

a plurality of first through electrodes;

a plurality of first wires; and a plurality of first conductive bumps configured to transmit data;

a plurality of second semiconductor chips sequentially stacked on the first semiconductor chip, the plurality of second semiconductor chips comprising:

a plurality of second through electrodes;

a plurality of second wires; and a plurality of second conductive bumps configured to transmit data;

at least one first temperature sensor provided on the central region of an uppermost semiconductor chip of the plurality of second semiconductor chips;

a plurality of second temperature sensors provided on the peripheral region of the uppermost semiconductor chip of the plurality of second semiconductor chips;

a thermal conductive member provided on the uppermost semiconductor chip of the plurality of second semiconductor chips and covering the at least one first temperature sensor and the plurality of second temperature sensors;

a cooling device provided on the thermal conductive member and configured to cool heat that is emitted from the first semiconductor chip and the plurality of second semiconductor chips; and a logic semiconductor chip configured to determine a heat dissipation state using temperature data obtained from the at least one first temperature sensor and the plurality of second temperature sensors, wherein the at least one first temperature sensor and the plurality of second temperature sensors are configured to transmit the temperature data obtained from the uppermost semiconductor chip to the logic semiconductor chip through the plurality of first through electrodes, the plurality of second through electrodes, the plurality of first wires, the plurality of second wires, the plurality of first conductive bumps and the plurality of second conductive bumps, and wherein a distance between adjacent ones of the at least one first temperature sensor and the plurality of second temperature sensors is a same first distance.

* * * * *